US006964573B2

(12) United States Patent
Asai et al.

(10) Patent No.: US 6,964,573 B2
(45) Date of Patent: Nov. 15, 2005

(54) ELECTRONIC PART-MOUNTING SOCKET

(75) Inventors: Kiyoshi Asai, Tokyo (JP); Kazuaki Kanazawa, Tokyo (JP); Junichi Kobayashi, Tokyo (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 11/089,346

(22) Filed: Mar. 24, 2005

(65) Prior Publication Data

US 2005/0215087 A1 Sep. 29, 2005

(30) Foreign Application Priority Data

Mar. 25, 2004 (JP) ............................ 2004-088393

(51) Int. Cl.[7] ............................................ H01R 12/00
(52) U.S. Cl. .......................... 439/71; 439/72; 439/862
(58) Field of Search ............................... 439/607, 493, 439/331, 70–74, 76.1, 862, 816, 838

(56) References Cited

U.S. PATENT DOCUMENTS 4,035,046 A * 7/1977 Kloth .......................... 439/71
4,050,755 A * 9/1977 Hasircoglu ................... 439/71
4,052,118 A * 10/1977 Scheingold et al. .......... 439/71
4,491,378 A * 1/1985 Crawford .................... 439/325
4,538,864 A * 9/1985 Ichimura ..................... 439/69
4,761,140 A * 8/1988 Geib ........................... 439/71
5,073,116 A * 12/1991 Beck, Jr. ..................... 439/71
5,458,498 A * 10/1995 Ii et al. ........................ 439/72
5,468,157 A * 11/1995 Roebuck et al. ............ 439/264

* cited by examiner

*Primary Examiner*—Michael C. Zarroli
(74) *Attorney, Agent, or Firm*—Pearne & Gordon LLP

(57) ABSTRACT

An electronic part-mounting socket includes a socket housing, and contacts The socket housing has contact receiving grooves formed at a bottom plate portion of an electronic part-receiving portion. The contact of an integral construction includes a fixing piece portion, a terminal piece portion laterally bent at a lower end of the fixing piece portion, a first bent-back portion formed by bending back a distal end portion of the terminal piece portion into a U-shape, an intermediate spring piece portion extending laterally from the first bent-back portion, a second bent-back portion formed by bending back a distal end portion of the intermediate spring piece portion into a U-shape, and a resilient contact piece portion extending continuously from the second bent-back portion in an upwardly-slanting manner. The fixing piece portions are inserted respectively in contact fixing holes, formed in the socket housing in an upward-downward direction, and are fixed thereto.

5 Claims, 10 Drawing Sheets

ELECTRONIC PART-MOUNTING SOCKET

BACKGROUND OF THE INVENTION

This invention relates to a socket for mounting an electronic part, mainly such as a camera module, on a printed wiring board.

Generally, an electronic device, such as a cellular phone, has a printed wiring board provided therein, and an electronic part such as a camera module is mounted on the printed wiring board. The electronic part, having a low degree of heat tolerance, can not be directly mounted on the board by soldering, and therefore is connected to the printed wiring board, using an electronic part-mounting socket as shown in FIG. 14.

This electronic part-mounting socket 1 is constituted by a socket housing 3 having an electronic part-receiving portion 2 formed by a peripheral wall extending upwardly from four sides of a square bottom plate, and a plurality of contacts 5 each having a resilient contact piece portion 5*a* which projects from the bottom plate so as to be resiliently contacted with a corresponding terminal portion of the electronic part such as a camera module and a semiconductor device. When the electronic part 4, such as a camera module and a semiconductor device, is held within the electronic part-receiving portion 2, the terminal portions of the electronic part 4 contact the resilient contact piece portions 5*a* of the contacts 5, respectively, so that the electronic part is electrically connected to the printed wiring board 6 via the contacts 5.

The contact 5 includes a flat plate-like fixing piece portion 5*b*, a terminal piece portion 5*c* bent at one end of the fixing piece portion 5*b*, an intermediate spring piece portion 5*d* which is bent at the other end of the fixing piece portion 5*b* remote from the terminal piece portion 5*c*, and assumes, together with the fixing piece portion 5*b*, an inverted U-shape, and the resilient contact piece portion 5*a* which is bent at that end of the intermediate spring piece portion 5*d* remote from the fixing piece portion 5*b* to extend in a slanting direction, and can be resiliently deformed through the intermediate spring piece portion 5*d*. The contacts 5 are inserted into the socket housing from the lower side of this socket housing.

In the above related technique, however, the resiliently-deformable portions of the contacts are located at the side portions of the socket, and therefore spaces for allowing the deformation of the contacts must be secured in the side walls of the socket housing. Therefore, the outer size increased, and this prevented the achievement of a compact design.

It may be proposed to provide a structure in which the contacts are inserted into the socket housing from the side portions of this socket housing in order to locate the resiliently-deformable portions of the contacts in the bottom portion of the socket. In such a structure, there was encountered a problem that the shape of the socket housing became complicated, and therefore the cost for a mold increased, and also the production cost increased.

SUMMARY OF THE INVENTION

In view of the problems of the above related technique, it is an object of this invention to provide an electronic part-mounting socket which can be formed into a compact design, and can be produced at a low cost.

In order to solve the aforesaid object, the invention is characterized by having the following arrangement.

(1) An electric part-mounting socket comprising:

- a socket housing that includes a bottom plate portion defining an electronic part-receiving portion with an open top for receiving at least a part of an electronic part in an upward-downward direction, a contact receiving groove formed through the bottom plate in the upward-downward direction and a contact fixing hole formed in the upward-downward direction; and
- a contact that is integrally formed and includes:
  - a fixing piece portion that is disposed to extend in the upward-downward direction and inserted into and fixed to the contact fixing hole;
  - a terminal piece portion for connection to a printed wiring board, which is laterally bent at a lower end of the fixing piece portion and received in the contact receiving groove;
  - a first bent-back portion that is formed by bending back a distal end portion of the terminal piece portion into generally U-shape;
  - an intermediate spring piece portion that extends laterally continuously from the first bent-back portion;
  - a second bent-back portion that is formed by bending back a distal end portion of the intermediate spring piece portion into a generally U-shape; and
  - a resilient contact piece portion that extends continuously from the second bent-back portion in a slanting manner.

(2) The electric part-mounting socket according to (1), wherein

- the contact receiving groove includes a terminal piece portion-receiving portion that is opened to a bottom surface of the socket housing so as to receive the terminal piece portion, and a resilient contact piece portion-receiving portion that is open to an inner side of the socket housing so as to receive the receive the resilient contact piece portion and the intermediate spring piece portion,
- the resilient contact piece portion-receiving portion is larger in width than the terminal piece portion-receiving portion, and the intermediate spring piece portion of the contact is larger in width than the terminal piece portion-receiving portion, and
- when the electronic part is received in the socket housing so that the resilient contact piece portion is pressed down, opposite side edge portions of the intermediate spring piece portion abut respectively against upper surfaces of opposite side edge portions of the terminal piece portion-receiving portion, thereby limiting the bending of the first bent-back portion.

(3) The electric part-mounting socket according to (1), wherein the intermediate spring piece portion is made larger in width than the terminal piece portion-receiving portion and the first bent-back portion.

(4) A contact for an electric part-mounting socket for connecting an electric part to printed wiring board, the contact comprising:

- a fixing piece portion that extends in a first direction;
- a terminal piece portion for contact with the printed wiring board, which is bent at an distal end of the fixing piece portion in a second direction substantially perpendicular to the first direction;

- a first bent-back portion that is formed by bending back a distal end portion of the terminal piece portion into generally U-shape;
- an intermediate spring piece portion that extends continuously from the first bent-back portion in the second direction;
- a second bent-back portion that is formed by bending back a distal end portion of the intermediate spring piece portion into a generally U-shape;
- a resilient contact piece portion that extends continuously from the second bent-back portion in a slanting manner; and
- a contact portion for contact with a terminal portion of the electronic part, which is formed at an end portion of the resilient contact piece portion,
- wherein the fixing piece portion, the terminal piece portion, the first bent-back portion, the intermediate spring piece portion, the second bent-back portion and the resilient contact piece portion are integrally formed.

(5) The contact according to (4), wherein the intermediate spring piece portion is made larger in width than the terminal piece portion-receiving portion and the first bent-back portion.

In this construction, the deformable portion of each contact is disposed at the bottom portion of the socket, and the thickness of the peripheral wall is prevented from increasing, so that the outer size of the socket housing can be made small, and besides the socket housing is not complicated in shape, and can be produced at a low cost. Further, stresses, acting on the resilient contact piece portion and the intermediate spring piece portion, are less liable to be transmitted to the terminal piece portion, so that the condition of connection of the terminal piece portion to the printed wiring board can be kept suitable.

DETAILED DESCRIPTION OF PREFERRED EMBODIMENTS

Figure 1:
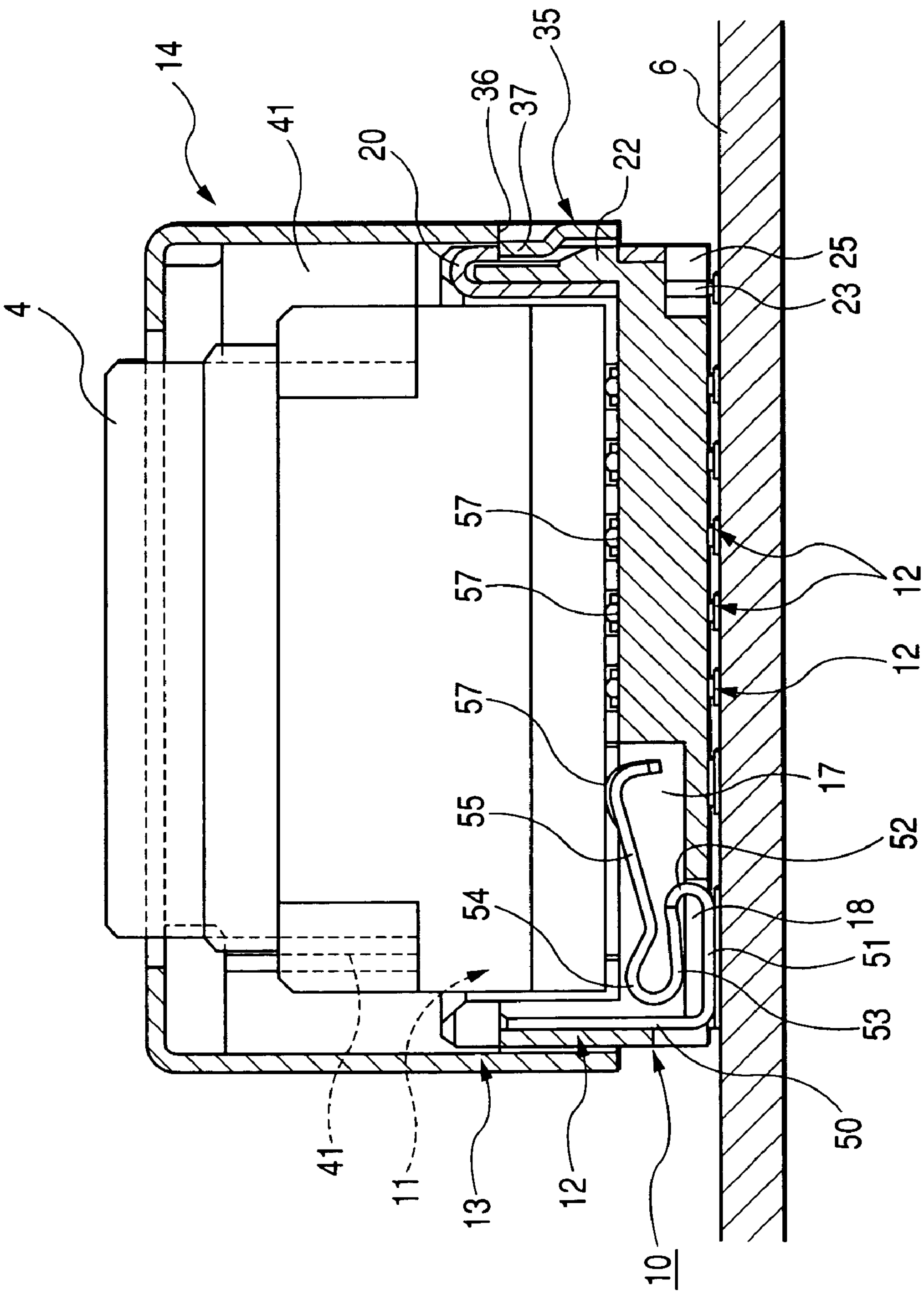
FIG. 1 is a cross-sectional view showing a condition in which an electronic part-mounting socket of the present invention is used.
Figure 2:
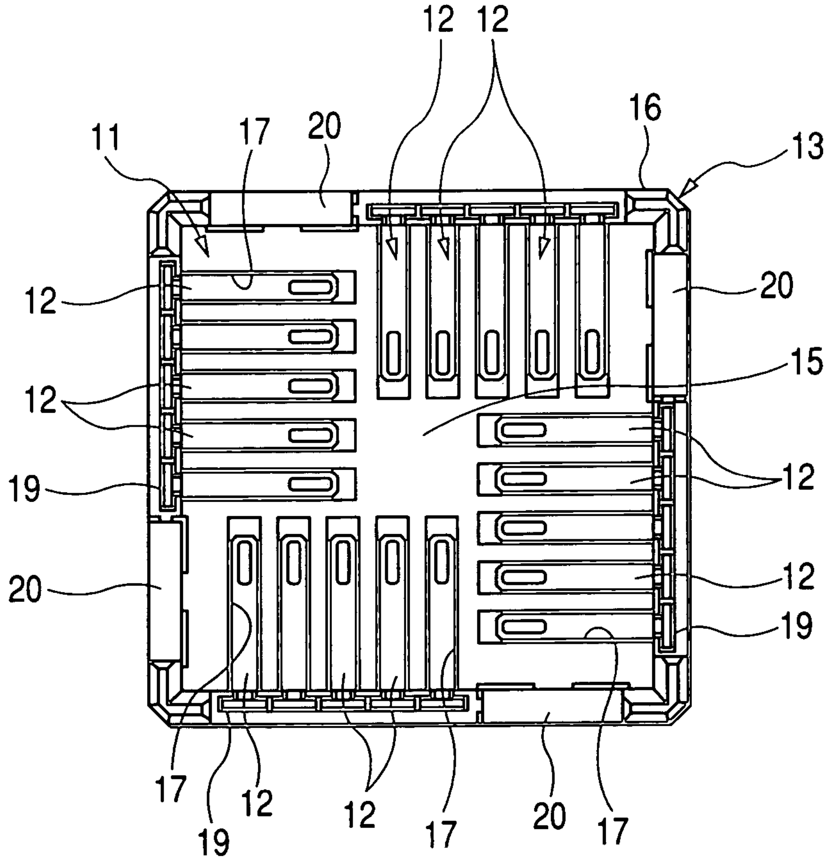
FIG. 2 is a plan view showing a condition in which contacts and shield assisting members are mounted on a socket housing shown in FIG. 1.
Figure 3:
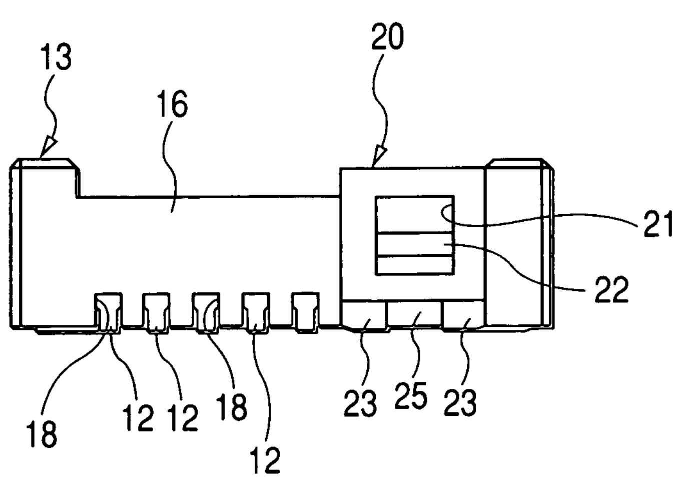
FIG. 3 is a front-elevational view of the above socket.
Figure 4:
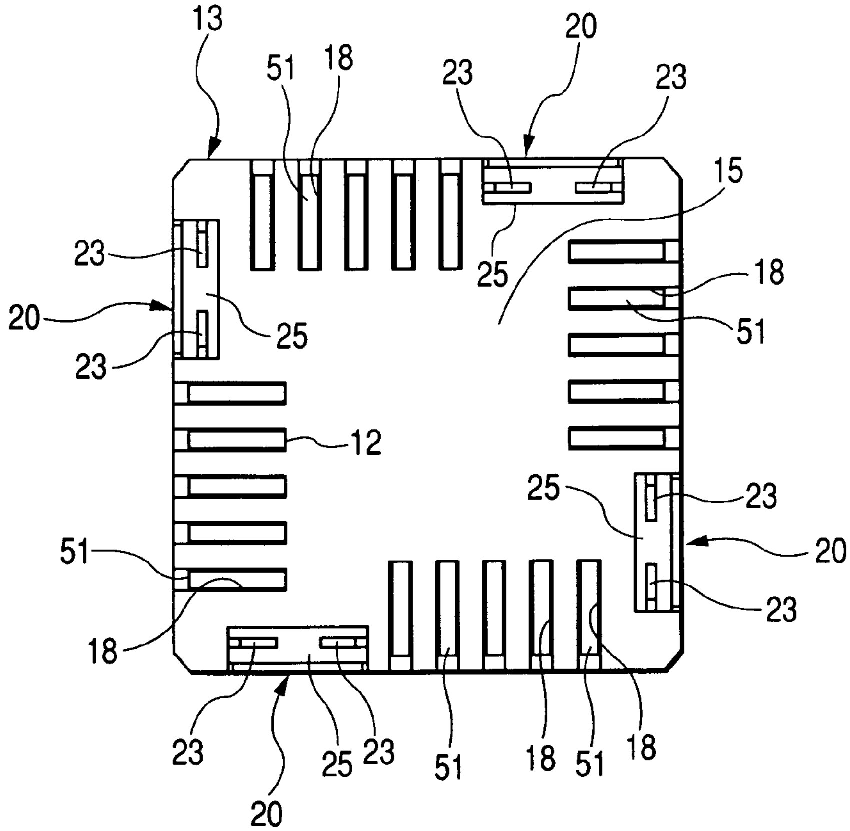
FIG. 4 is a bottom view of the above socket.
Figure 5:
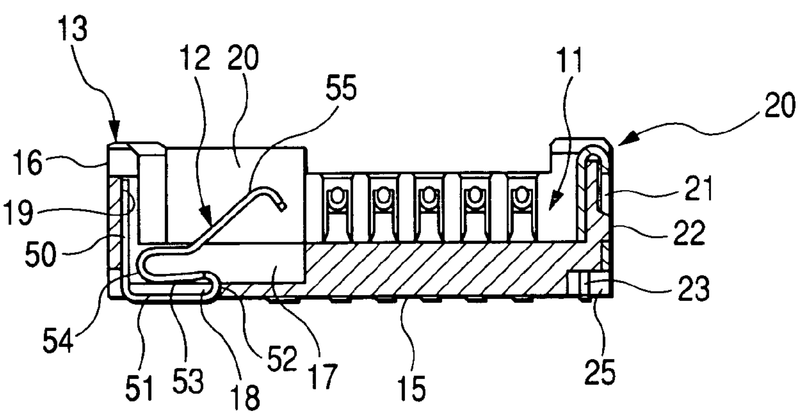
FIG. 5 is a cross-sectional view of the above socket.
Figure 6:
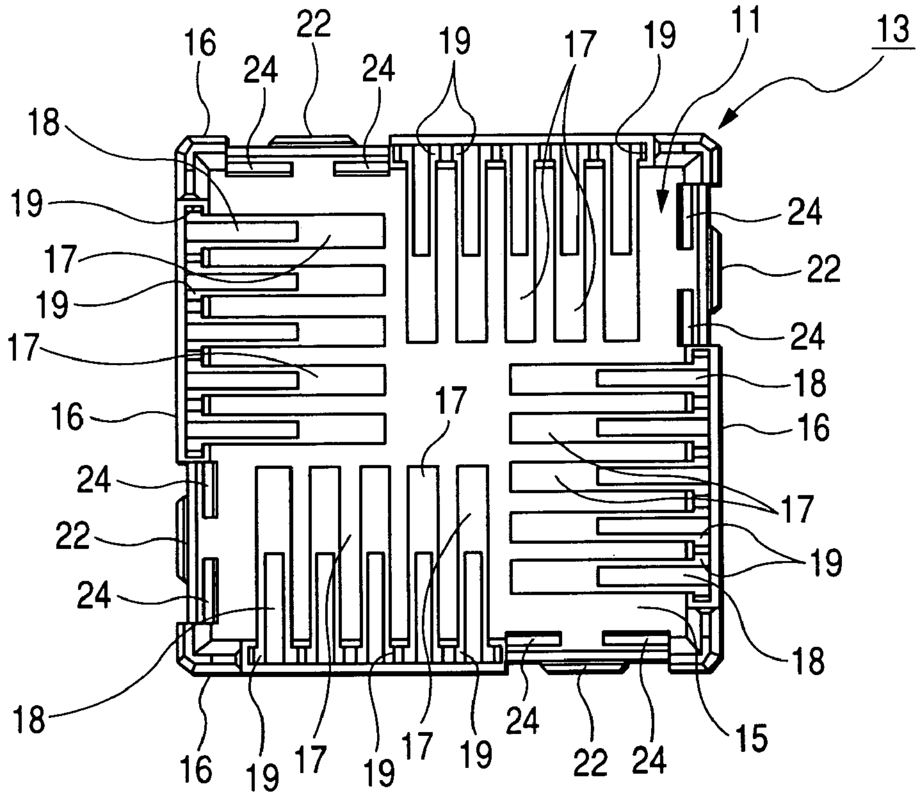
FIG. 6 is a plan view of the socket housing.
Figure 7:
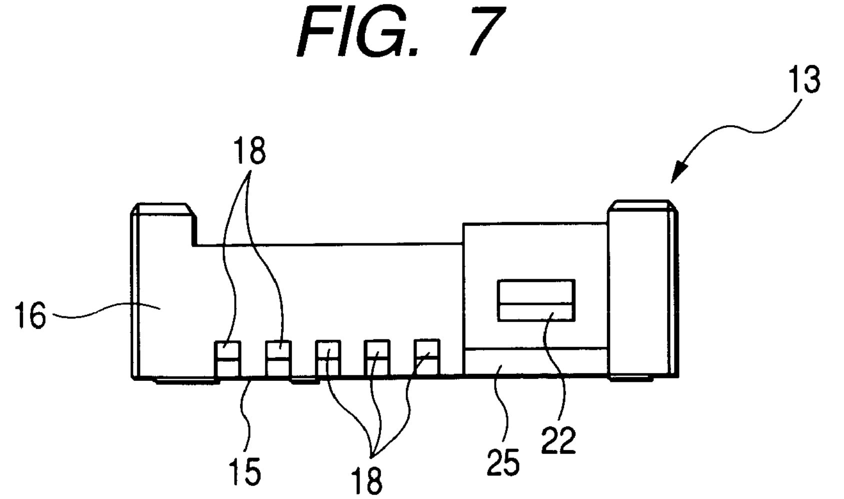
FIG. 7 is a front-elevational view of the socket housing.
Figure 8:
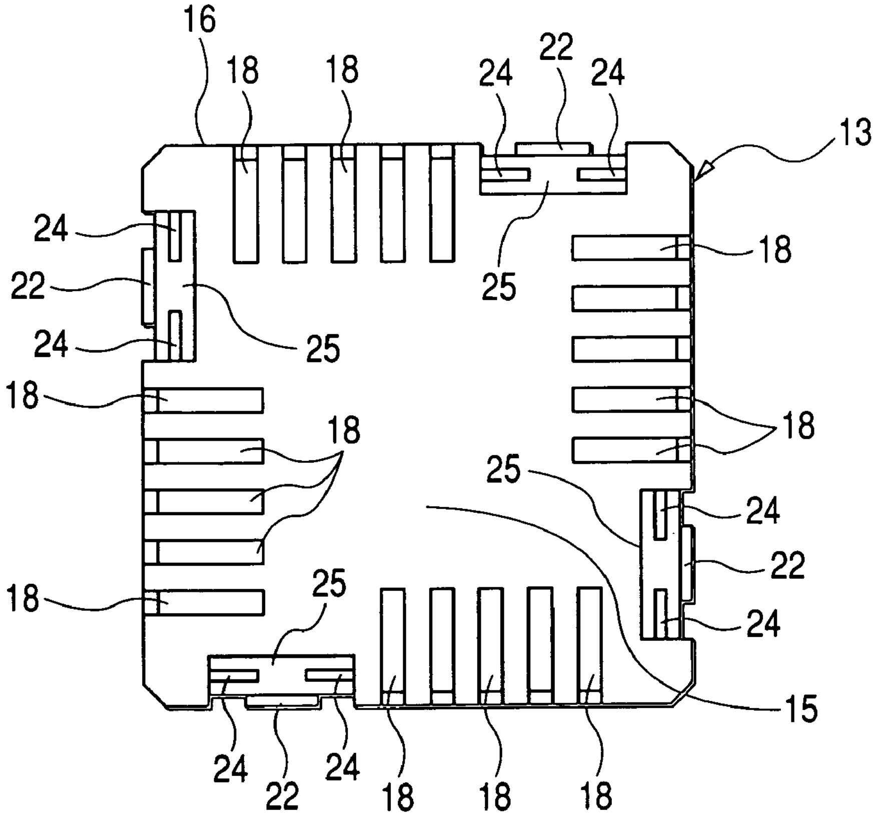
FIG. 8 is a bottom view of the socket housing.
Figure 9:
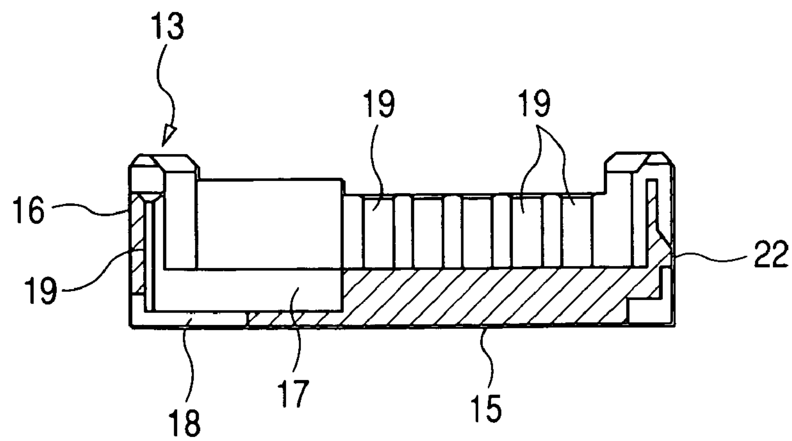
FIG. 9 is a vertical cross-sectional view of the socket housing.

An electronic part-mounting socket according to the present invention will now be described with reference to FIGS. 1 to 13. Identical portions to those of the above example will be designated by identical reference numerals, respectively, and explanation thereof will be omitted.

FIG. 1 shows a condition of use in which an electronic part such as a camera module is mounted on a printed wiring board through the electric part-mounting socket. In the drawings, reference numeral 10 denotes the electronic part-mounting socket, reference numeral 4 the camera module, and reference numeral 6 the printed wiring board.

The electronic part-mounting socket 10 includes a socket housing 13 having an electronic part-receiving portion 11 with an open top for receiving part or the whole of the electronic part 4, and a plurality of contacts 12 supported on the socket housing 13. The electronic part 4, when received in the electronic part-receiving portion 11, is connected to the printed wiring board 6 via the contacts 12.

The electronic part-mounting socket 10 further includes a box-like shield casing 14 fitted on the outer periphery of the socket housing 13, and the shielding is effected by this shield casing 14.

As shown in FIGS. 6 to 9, the socket housing 13 is formed into an integral construction, using an insulative material such as a synthetic resin, and includes a square bottom plate 15, and a peripheral wall 16 extending upright from four sides of the bottom plate 15. The electronic part-receiving portion 11 for receiving the electronic part 4 is defined by the bottom plate 15 and the peripheral wall 16.

The socket housing 13 includes a plurality of contact receiving grooves formed through the bottom plate portion of the electronic part-receiving portion 11 (that is, through the bottom plate 15 of the socket housing) in an upward-downward direction, and each of the contact receiving grooves has a narrow elongate shape, and extends long from a corresponding one of the four sides of the bottom plate 15 toward the opposite side thereof, and terminates slightly short of a mid point between the opposite side walls.

Each of the contact receiving grooves includes a terminal piece portion-receiving portion 18 which is open to the bottom surface of the socket housing so as to receive a terminal piece portion of the contact, and a resilient contact piece portion-receiving portion 17 which is open to the inner side of the socket housing so as to receive a resilient contact piece portion and an intermediate spring piece portion of the contact, the resilient contact piece portion-receiving portion 17 being larger in width than the terminal piece portion-receiving portion 18.

The contact receiving grooves are provided in groups such that each group of contact receiving grooves extend in a parallel juxtaposed manner from a corresponding one of the four sides of the bottom plate 15 toward the opposite side thereof. With respect to the contact receiving groove groups provided respectively in any two adjacent ones of the four sides of the bottom plate 15, the distal end of one of the two contact receiving groove groups is directed toward the side of the other contact receiving groove group.

The contact receiving groove group, provided in each side of the bottom plate, is arranged to be shifted from the adjacent contact receiving groove group along this side at least by a distance corresponding to the longitudinal length of these adjacent contact receiving grooves.

A flat suction portion for transfer purposes is formed at a central portion of the bottom plate 15 surrounded by the distal ends of the contact receiving groove groups. By drawing this suction portion by a nozzle, the socket housing can be transferred in an automatic machine or the like.

The peripheral wall 16 is formed on and extend upright from the four sides of the bottom plate 15. A plurality of contact fixing holes 19 (in which fixing piece portions of the contacts can be inserted, respectively) are formed in the peripheral wall, and are open to the upper surface in continuous relation to the contact receiving grooves, respectively.

A shield assisting member 20 is mounted at a side portion of each side wall of the peripheral wall 16, that is, at that side portion opposite from the contact receiving groove group.

Each of the shield assisting member 20 is formed by bending an electrically-conductive sheet (such as a sheet of a tinned copper alloy) in two, and each shield assisting member 20 grips the peripheral wall 16 to be fixed thereto.

Those portions of the peripheral wall on which the shield assisting members 20 are to be mounted, respectively, are reduced in thickness such that the sum of the thicknesses of each reduced-thickness wall portion and shield assisting member 20 is generally equal to the thickness of the other portion of the peripheral wall.

A retaining hole 21 is formed in an outer surface of each shield assisting member 20, and fixing projections, projecting from the inner surface of the shield casing 14, can be engaged with the retaining holes 21, respectively. Fixing projections 22, projecting from the peripheral wall of the socket housing, can be engaged with lower edges of the retaining holes 21, respectively, thereby fixing the shield assisting members 20 to the peripheral wall 16.

Soldering lugs 23 are formed integrally at a lower edge of an inner side portion of each shield assisting member 20, and these soldering lugs 23 can be press-fitted respectively in press-fitting holes 24 formed through the bottom plate 15, with their distal ends exposed to a recess portion 25 formed in the bottom surface of the socket housing 13.

Figure 10A:
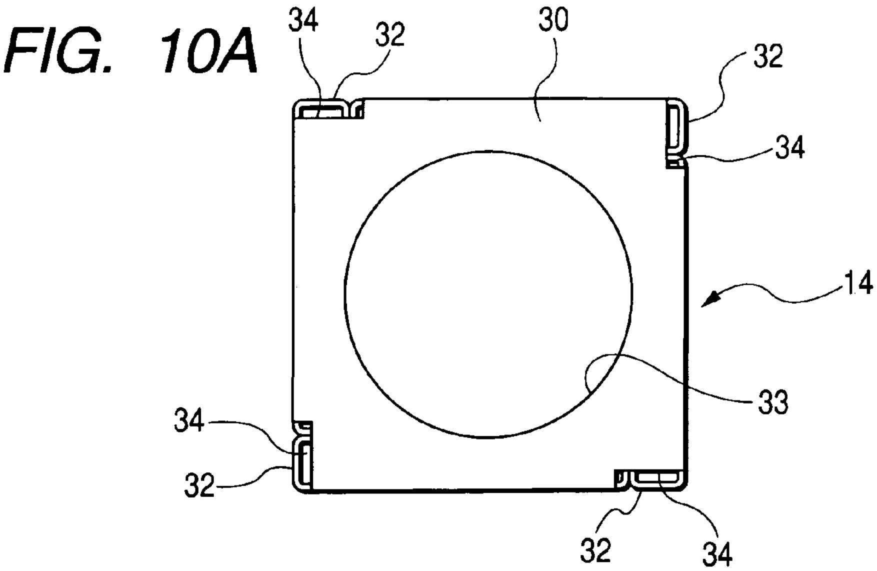
FIG. 10A is a plan view of a shield casing shown in FIG. 1.
Figure 10B:
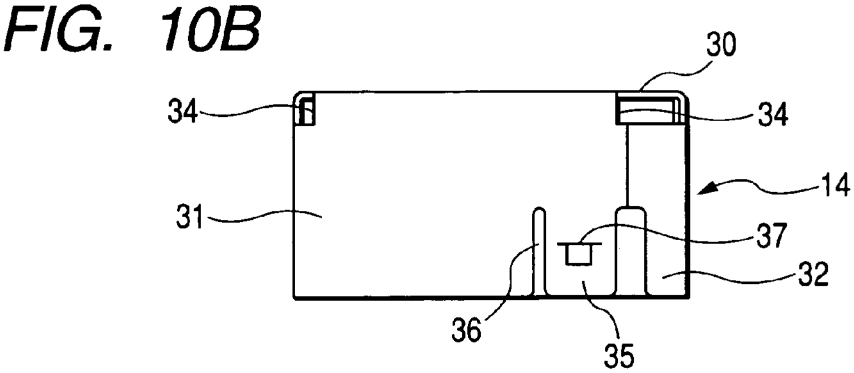
FIG. 10B is a front-elevational view thereof.
Figure 10C:
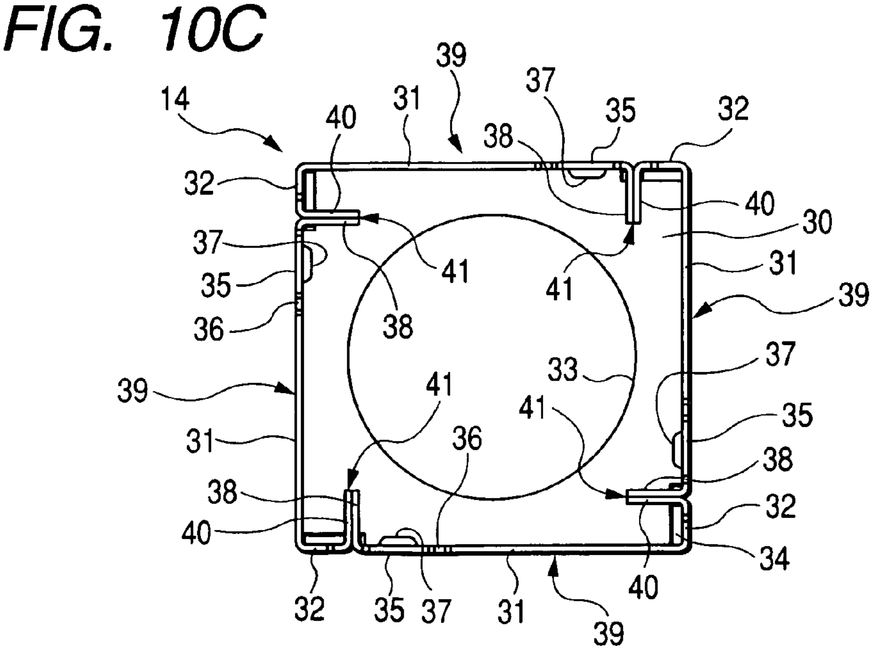
FIG. 10C is a bottom view thereof.
Figure 11:
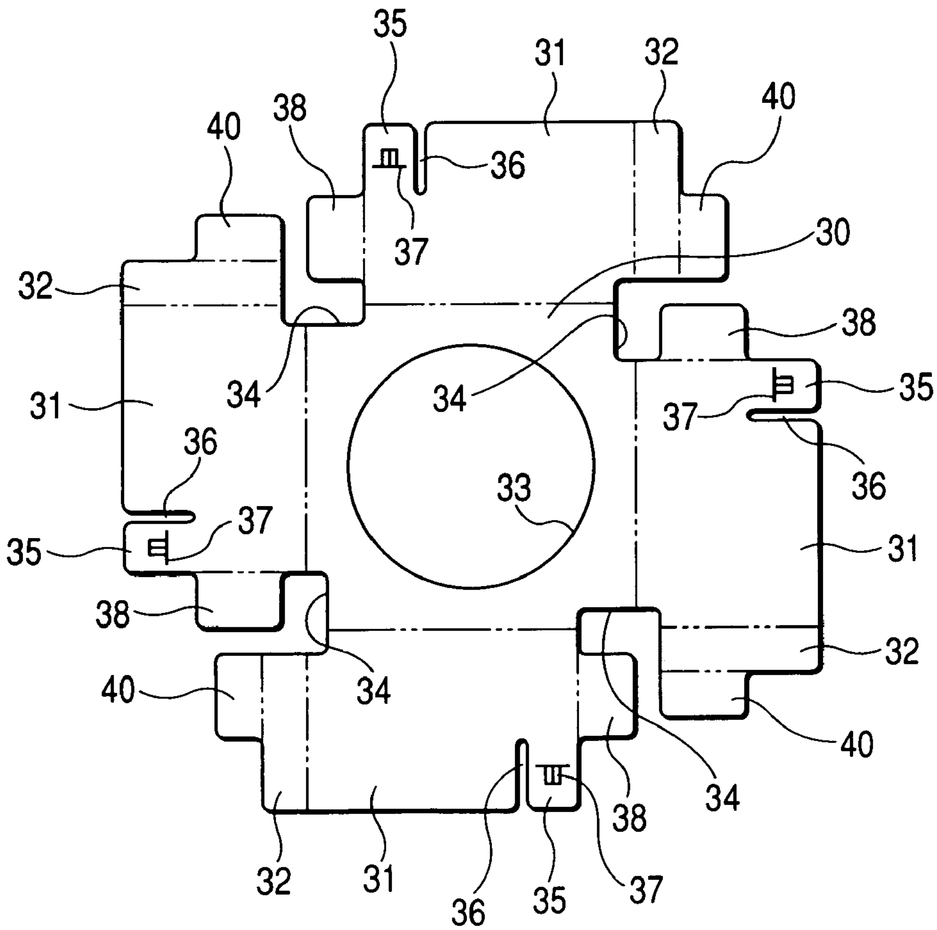
FIG. 11 is a development view of the shield casing.
Figure 12A:
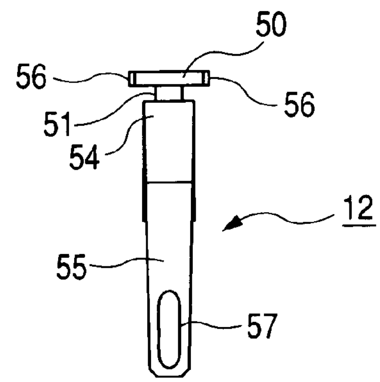
FIG. 12A is a plan view of a contact shown in FIG. 1.
Figure 12B:
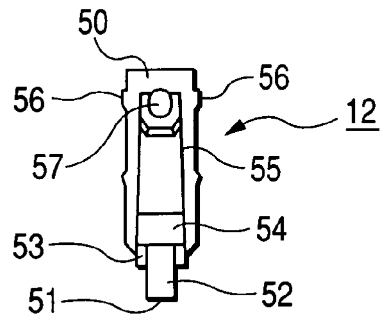
FIG. 12B is a front-elevational view thereof.
Figure 12C:
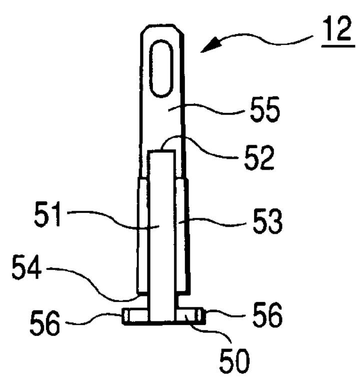
FIG. 12C is a bottom view thereof.
Figure 12D:
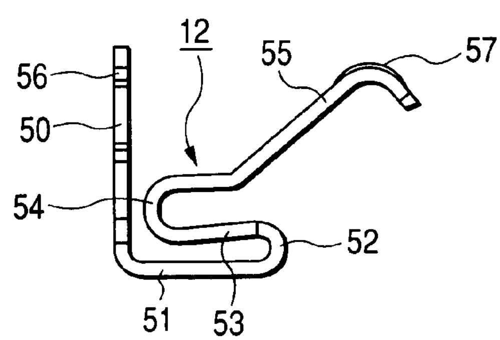
FIG. 12D is a side-elevational view thereof.

As shown in FIGS. 10A to 10C, the shield casing 14 is formed into a box-like shape with an open bottom, and this shield casing is formed by blanking a piece from an electrically-conductive sheet material such as a sheet of a tinned copper alloy as shown in FIG. 11 (which is a development view) and then by bending it. In the drawings, dots-and-dash lines indicate bending lines.

This shield casing 14 includes a flat plate-like top plate 30, main side wall plates 31 integrally formed respectively with the four sides of the top plate 30 via respective bending lines, and auxiliary side wall plates 32 integrally formed respectively with one edges of the main side wall plates 31 (that is, corresponding side edges of the main side wall plates 31 in the peripheral direction) via respective bending lines.

An insertion hole 33 for the projection of part (a lens portion) of the camera module therethrough is formed through a central portion of the top plate 30, and notches 34 for bending purposes are formed in four corner portions of this top plate, respectively.

Each main side wall plate 31 is formed into a flat plate-like shape, and a resilient retaining portion 35 is formed at the main side wall plate 31 so as to be positioned corresponding to the corresponding shield assisting member 20 on the socket housing.

The resilient retaining portion 35 is formed by forming a slit 36 extending from a lower edge of the main side wall plate 31 (that is, that edge facing away from the bending line) in a direction perpendicular to this edge. A fixing projection 37 is formed at a central portion of the resilient retaining portion 35 by inwardly indenting the relevant portion of the sheet such that the fixing projection 37 projects inwardly in the assembled condition.

The auxiliary side wall plate 32 is formed integrally with one side edge of each main side wall plate 31 via the bending line, while a pressing piece portion 38 is formed integrally with the other side edge thereof via a bending line.

The auxiliary side wall plate 32 is bent at the bending line, and its edge, facing away from this bending line, is mated with the side edge of the adjacent main side wall plate 31 so as to form, together with this adjacent main side wall plate 31, an adjacent side wall 39.

A pressing piece portion 40 is formed integrally with that edge of the auxiliary side wall plate 32, facing away from the bending line, via a bending line.

The adjacent pressing piece portions 38 and 40, bent inwardly at the respective bending lines, are mated with each other to form a pressing portion 41.

As shown in FIGS. 12A to 12D, the contact 12 of an integral construction includes a fixing piece portion 50, a terminal piece portion 51, a first bent-back portion 52, an intermediate spring piece portion 53, a second bent-back portion 54, and a resilient contact piece portion 55. The contact is formed by blanking a metallic sheet material into a predetermined shape and then by bending it.

The fixing piece portion 50 is disposed to extend in the upward-downward direction relative to the socket housing, and is formed into a flat plate-like shape, and is larger in width than the contact fixing hole.

A pair of retaining projections 56 are formed integrally on opposite side edges of the fixing piece portion 50. When the opposite side portions of the fixing piece portion 50 are fitted into the contact fixing hole 19, the pair of retaining projections 56 are brought into biting engagement with side edge portions of the contact fixing hole 19, thereby mounting the contact 12 on the socket housing 13.

The terminal piece portion 51 is bent laterally at the lower end of the fixing piece portion 50. When the contact 12 is mounted on the socket housing 13, the lower surface of the terminal piece portion 51 is exposed through the lower open side of the terminal piece portion-receiving portion 18 in the socket housing 13.

The terminal piece portion 51 has a strip-like shape, and is smaller in width than the fixing piece portion 50.

The first bent-back portion 52 is formed by bending a distal end portion of the terminal piece portion 51 (that is, that end portion thereof remote from the fixing piece portion 50) into a generally U-shape, and the width of this first bent-back portion is equal to the width of the terminal piece portion 51.

The intermediate spring piece portion 53 is formed into a flat plate-like shape, and extends continuously from that end of the first bent-back portion 52 remote from the terminal piece portion 51. This intermediate spring piece portion is larger in width than the terminal piece portion 51 and the first bent-back portion 52.

The second bent-back portion 54 is formed by bending back a distal end portion of the intermediate spring piece portion 53 (that is, that end portion thereof remote from the first bent-back portion 52) into a generally U-shape.

The first bent-back portion 52, the intermediate spring piece portion 53 and the second bent-back portion 54 are arranged to jointly assume a S-shape when viewed from the side.

The resilient contact piece portion 55 extends continuously from the end of the second bent-back portion 54 remote from the intermediate spring piece portion 53, and is slanting upwardly. A distal end portion of the resilient contact piece portion 55 is bent into a generally inverted V-shape to form a contact portion 57 for contact with a terminal portion of the electronic part 4.

The intermediate spring piece portion 53 and the resilient contact piece portion 55, when pressed from the upper side, are bent at the first and second bent-back portions 52 and 54 to be resiliently deformed.

Figure 13A:
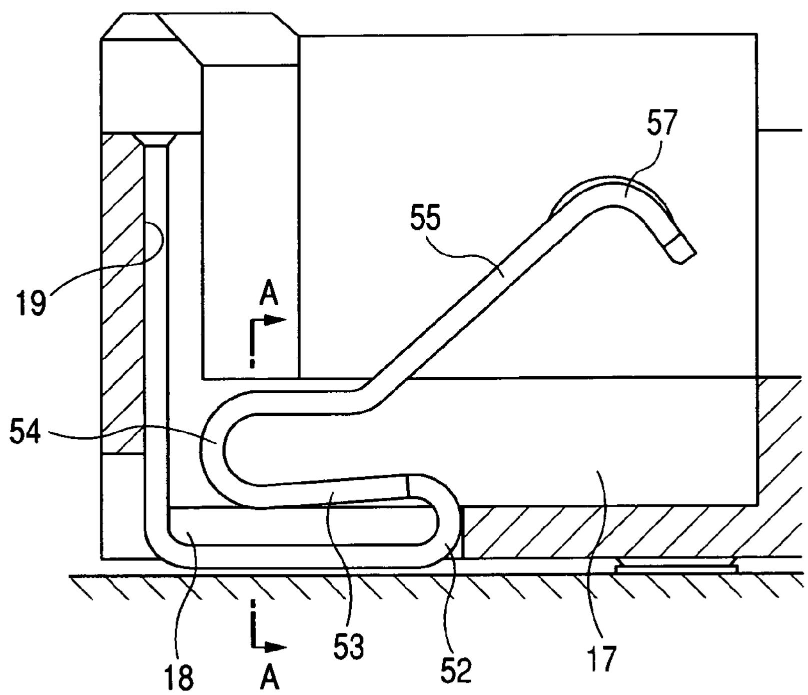
FIG. 13A is a cross-sectional view showing a mounted condition of the contact.
Figure 13B:
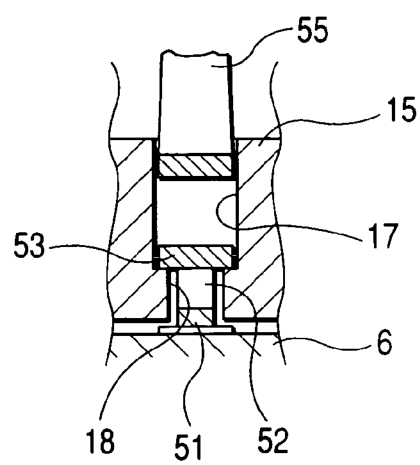
FIG. 13B is a cross-sectional view taken along the line A—A of FIG. 13A.
Figure 14:
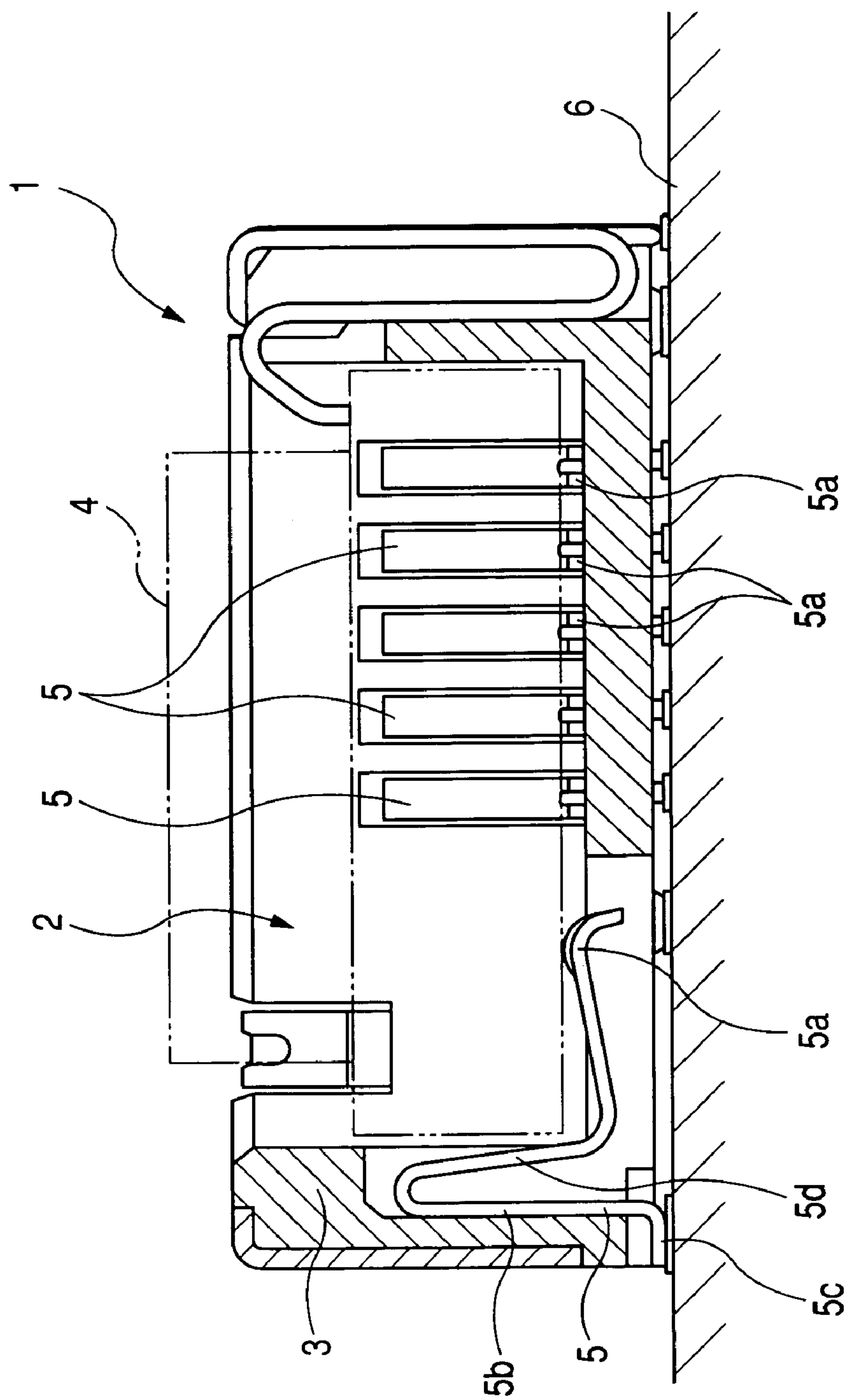
FIG. 14 is a vertical cross-sectional view showing one conventional electronic part-mounting socket.

When the fixing piece portion 50 of the contact 12 is inserted into the contact fixing hole 19 from the upper side of the socket housing 13, so that the contact is held on the socket housing 13 as shown in FIG. 13, the intermediate spring piece portion 53 is located in the resilient contact piece portion-receiving portion 17, that is, the bottom portion of the socket housing 13, while the distal end portion of the resilient contact piece portion 55 projects beyond the upper surface of the bottom plate 15, that is, into the electronic part-receiving portion 11.

When the resilient contact piece portion 55 is pressed downward upon reception of the electronic part 4 in the electronic part-receiving portion 11, this resilient contact piece portion 55 escapes into the resilient contact piece portion-receiving portion 17, and will not contact the bottom plate 15.

The resilient contact piece portion-receiving portion 17 is made larger in width than the terminal piece portion-receiving portion 18, and also the intermediate spring piece portion 53 of the contact 12 is made larger in width than the terminal piece portion-receiving portion 18, and therefore the first bent-back portion 52 is made smaller in width than the intermediate spring piece portion 53, the second bent-back portion 54 and the resilient contact piece portion 55 (that is, the elastic modulus of the first bent-back portion 52 is lower than that of these portions). With this construction, first, the first bent-back portion 52 is resiliently deformed, and the intermediate spring piece portion 53 is supported on the bottom surface of the resilient contact piece portion-receiving portion 17, that is, on the edge portions of the upper opening of the terminal piece portion-receiving portion 18. Therefore, stresses, produced when the intermediate spring piece portion 53 and the resilient contact piece portion 55 are resiliently deformed, are less liable to be transmitted to the terminal piece portion 51, so that the condition of connection of the terminal piece portion 51 to the printed wiring board 6, that is, the soldered condition thereof, can be kept suitable.

The contacts 12 are mounted in groups on the socket housing 13 such that the resilient contact piece portions 55 of each group of contacts 12 extend in a parallel juxtaposed manner from a corresponding one of the four sides of the bottom plate 15 toward the opposite side thereof.

In the electronic part-mounting socket 10 of the above construction, the electronic part (camera module) 4 is inserted into the electronic part-receiving portion 11, and then when the shield casing 14 is fitted thereon, the lower edges of the pressing portions 41, provided in a projected manner within the shield casing 14, are brought into abutting engagement with an upper edge portion of the electronic part 4.

The shield casing is pressed down until the fixing projections 37 of the resilient retaining portions 35 become engaged respectively in the retaining holes 21 of the shield assisting members 20, so that the shield casing 14 is fitted on the outer periphery of the socket housing 13 against withdrawal therefrom. At this time, the electronic part 4 is pressed downward (that is, toward the contacts) by the pressing portions 41, and the electronic part 4 is held in the electronic part-receiving portion 11 in such a manner that the terminal portions of the electronic part 4 are contacted respectively with the resilient contact piece portions 55 of the contacts 12 with a suitable contact pressure.

As a result, the electronic part 4 is mounted on the electronic part-mounting socket 10, and also the electronic part 4 is shielded, and the electronic part 4 is electrically connected to the printed wiring board 6 via the electronic part-mounting socket 10.

In the above embodiment, although the camera module is used as the electronic part 4, a high-frequency electronic part such as a camera module and an IC chip, a semiconductor device or any other suitable electronic part can be used as the electronic part.

What is claimed is:

1. An electric part-mounting socket comprising:

a socket housing that includes a bottom plate portion defining an electronic part-receiving portion with an open top for receiving at least a part of an electronic part in an upward-downward direction, a contact receiving groove formed through the bottom plate in the upward-downward direction and a contact fixing hole formed in the upward-downward direction; and a contact that is integrally formed and includes:

- a fixing piece portion that is disposed to extend in the upward-downward direction and inserted into and fixed to the contact fixing hole;
- a terminal piece portion for connection to a printed wiring board, which is laterally bent at a lower end of the fixing piece portion and received in the contact receiving groove;
- a first bent-back portion that is formed by bending back a distal end portion of the terminal piece portion into generally U-shape;
- an intermediate spring piece portion that extends laterally continuously from the first bent-back portion;
- a second bent-back portion that is formed by bending back a distal end portion of the intermediate spring piece portion into a generally U-shape; and
- a resilient contact piece portion that extends continuously from the second bent-back portion in a slanting manner.

2. The electric part-mounting socket according to claim 1, wherein the contact receiving groove includes a terminal piece portion-receiving portion that is opened to a bottom surface of the socket housing so as to receive the terminal piece portion, and a resilient contact piece portion-receiving portion that is open to an inner side of the socket housing so as to receive the receive the resilient contact piece portion and the intermediate spring piece portion, the resilient contact piece portion-receiving portion is larger in width than the terminal piece portion-receiving portion, and the intermediate spring piece portion of the contact is larger in width than the terminal piece portion-receiving portion, and when the electronic part is received in the socket housing so that the resilient contact piece portion is pressed down, opposite side edge portions of the intermediate spring piece portion abut respectively against upper surfaces of opposite side edge portions of the terminal piece portion-receiving portion, thereby limiting the bending of the first bent-back portion.

3. The electric part-mounting socket according to claim 1, wherein the intermediate spring piece portion is made larger in width than the terminal piece portion-receiving portion and the first bent-back portion.

4. A contact for an electric part-mounting socket for connecting an electric part to printed wiring board, the contact comprising:

a fixing piece portion that extends in a first direction;

a terminal piece portion for contact with the printed wiring board, which is bent at an distal end of the fixing piece portion in a second direction substantially perpendicular to the first direction;

a first bent-back portion that is formed by bending back a distal end portion of the terminal piece portion into generally U-shape;

an intermediate spring piece portion that extends continuously from the first bent-back portion in the second direction;

a second bent-back portion that is formed by bending back a distal end portion of the intermediate spring piece portion into a generally U-shape;

a resilient contact piece portion that extends continuously from the second bent-back portion in a slanting manner; and a contact portion for contact with a terminal portion of the electronic part, which is formed at an end portion of the resilient contact piece portion, wherein the fixing piece portion, the terminal piece portion, the first bent-back portion, the intermediate spring piece portion, the second bent-back portion and the resilient contact piece portion are integrally formed.

5. The contact according to claim 4, wherein the intermediate spring piece portion is made larger in width than the terminal piece portion-receiving portion and the first bent-back portion.

* * * * *